United States Patent
Wu

(10) Patent No.: US 7,439,870 B2
(45) Date of Patent: Oct. 21, 2008

(54) APPARATUS FOR TESTING CABLES

(75) Inventor: Sheng-Liang Wu, Shenzhen (CN)

(73) Assignees: Hong Fu Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 108 days.

(21) Appl. No.: 11/308,742

(22) Filed: Apr. 28, 2006

(65) Prior Publication Data
US 2007/0030011 A1    Feb. 8, 2007

(30) Foreign Application Priority Data
Aug. 4, 2005    (CN) ............... 2005 2 0062584

(51) Int. Cl.
*G08B 21/00* (2006.01)
(52) U.S. Cl. .................... 340/660; 324/539
(58) Field of Classification Search ......... 340/660; 324/539, 542, 66
See application file for complete search history.

(56) References Cited

U.S. PATENT DOCUMENTS

| | | | | |
|---|---|---|---|---|
| 4,471,293 A | * | 9/1984 | Schnack | 324/540 |
| 4,736,158 A | * | 4/1988 | McCartney | 324/66 |
| 4,974,311 A | * | 12/1990 | Tran | 29/566.3 |
| H1369 H | * | 11/1994 | Verbin | 324/539 |
| 5,621,600 A | * | 4/1997 | Iijima | 361/93.6 |
| 7,116,112 B1 | * | 10/2006 | Shu | 324/539 |

FOREIGN PATENT DOCUMENTS

CN    00200774.6    6/2001

* cited by examiner

*Primary Examiner*—George A Bugg
*Assistant Examiner*—Hoi C Lau
(74) *Attorney, Agent, or Firm*—Wei Te Chung

(57) ABSTRACT

An apparatus is provided for testing a cable having a plurality of conductors. The apparatus includes a power supply terminal, a grounded test probe, an interface having a plurality of pins thereon, a plurality of indicators, and a plurality of control circuits, each of the indicators corresponding to a pin of the interface. Anodes of the indicators are connected to the power supply terminal, each of the pins and a cathode of a corresponding indicator are correspondingly connected to one control circuit, when the test probe touches one pin of the interface, the corresponding indicator will be lit.

10 Claims, 5 Drawing Sheets

APPARATUS FOR TESTING CABLES

CROSS-REFERENCES TO RELATED APPLICATION

Relevant subject matter is disclosed in co-pending U.S. Patent Application entitled "Apparatus for Testing Electric Cables" filed on Apr. 22, 2006 with application serial number 11/308,695, and assigned to the same assignee as this application.

FIELD OF THE INVENTION

The present invention relates generally to test equipment, and more specifically to an apparatus for testing cables used in electronics.

DESCRIPTION OF THE RELATED ART

During the installation of or interconnection of various equipment in computers, it is necessary to make frequent wire checks verifying the integrity of connections made by means of cables utilized to interconnect various equipment. It is necessary that the cable be checked for a number of wire faults, such as opens and shorts between wires.

A number of test apparatuses or methods have been developed for making checks of cable for shorts and opens. One such method is to employ a multi-meter to test each conductor of the cable one by one. However, the multi-meter is only capable of indicating an open state.

What is desired, therefore, is an apparatus which can test for both opens and shorts in cables.

SUMMARY OF THE INVENTION

In one preferred embodiment, an apparatus is provided for testing a cable having a plurality of conductors. The apparatus includes a power supply terminal, a grounded test probe, an interface having a plurality of pins thereon, a plurality of indicators, and a plurality of control circuits. Each of the indicators corresponding to a pin of the interface. Anodes of the indicators are connected to the power supply terminal, each of the pins and a cathode of the corresponding indicator are correspondingly connected to one control circuit, when the test probe touches one pin of the interface, the corresponding indicator will be lit.

Other advantages and novel features will become more apparent from the following detailed description when taken in conjunction with the accompanying drawings, in which:

DETAILED DESCRIPTION OF THE INVENTION

Figure 1:
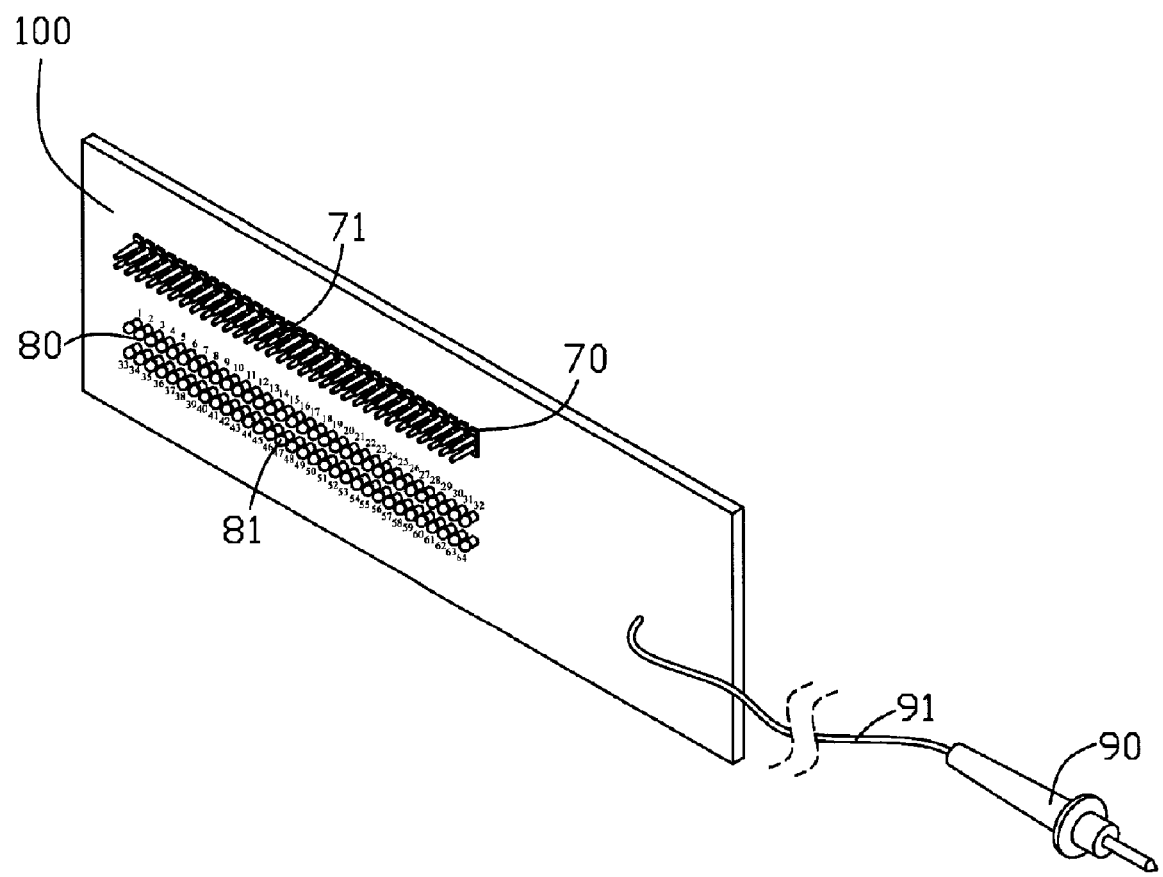
FIG. 1 is an isometric view of a plate of a cable testing apparatus in accordance with a preferred embodiment of the present invention.
Figure 2:
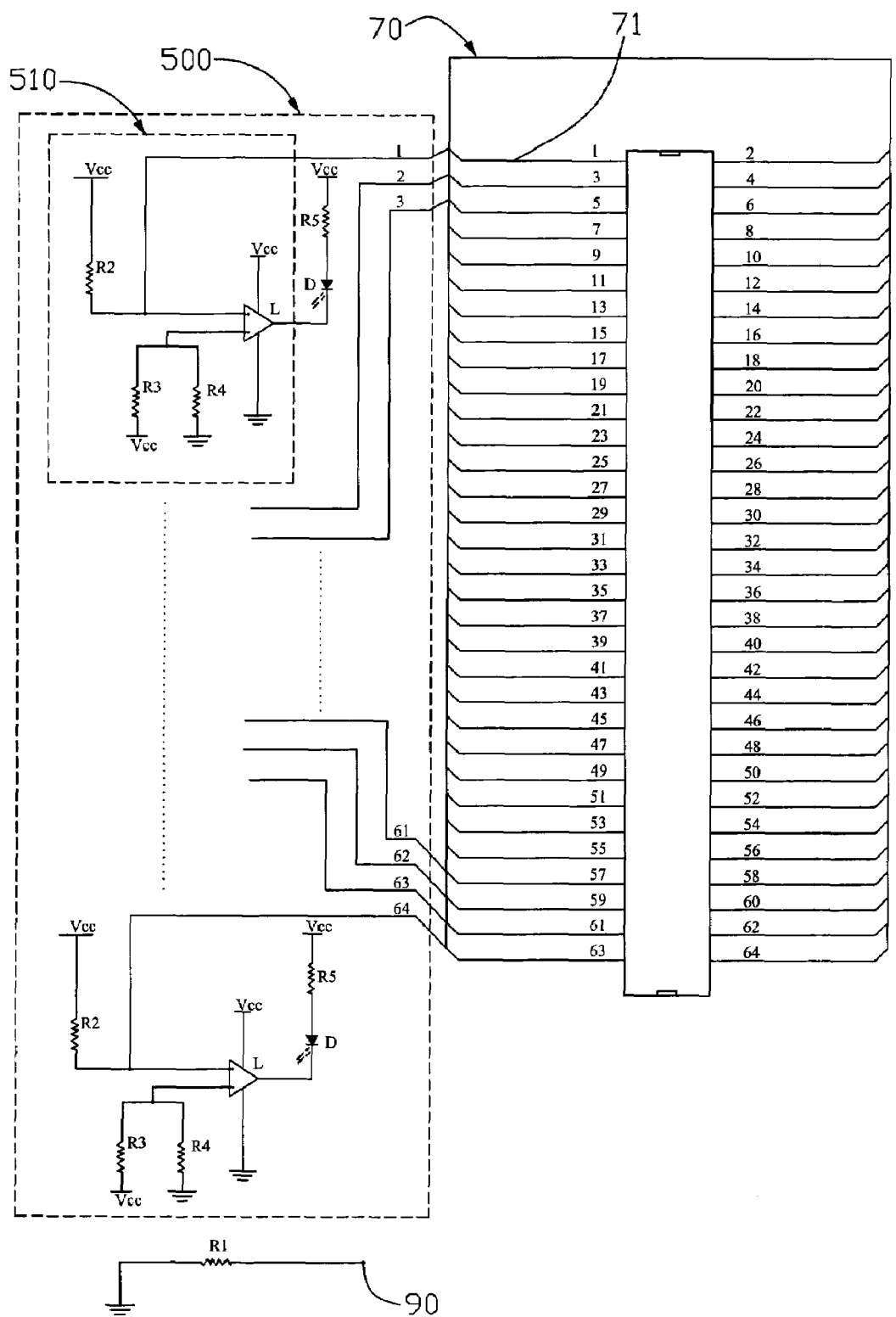
FIG. 2 is a circuit diagram of the testing apparatus of FIG. 1, together with an interface defined on the plate of the testing apparatus.

Referring to FIGS. 1 and 2, a cable testing apparatus in accordance with a preferred embodiment of the present invention includes a plate 100, a test circuit 500, a test probe 90, a lead 91 for connecting the plate 100 with the test probe 90, and a direct current (DC) power supply terminal Vcc. An interface 70 and an indicator array 80 are defined on the plate 100. The interface 70 includes a plurality of pins 71 (typically there are sixty four pins). The indicator array 80 includes a plurality of indicators 81 of the same amount corresponding to the amount of the pins 71. In this embodiment, the indicators 81 are light emitting diodes (LEDs) and generally are consecutively labeled 1, 2, 3 . . . 64. The test circuit 500 includes a plurality of same control circuits 510 of the same amount corresponding to the amount of the pins 71. Each pin 71 and each indicator 81 (shown in FIG. 2 as D) are correspondingly connected to a control circuit 510. The label of each indicator corresponding to a sequence number of each pin 71. The lead 91 is grounded via a first resistor R1.

As the control circuits 510 are all the same, only one control circuit 510 will be described hereinafter.

Figure 3:
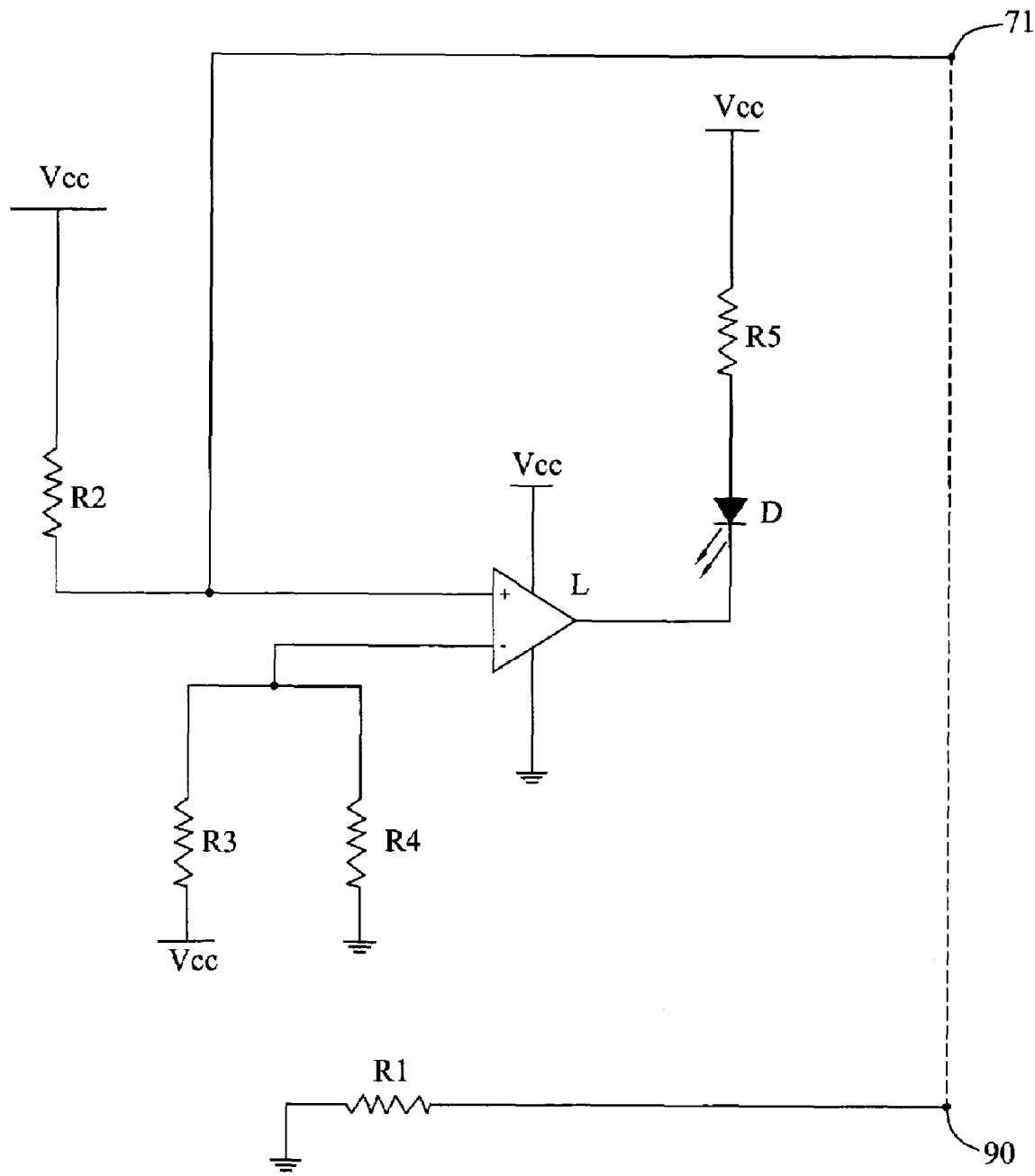
FIG. 3 is a circuit diagram of one control circuit of the testing apparatus of FIG. 2, together with a resistor and a corresponding indicator of the control circuit to be connected thereto.

Referring also to FIG. 3, each of the control circuits 510 includes a voltage comparator L. An output terminal of the comparator L is connected to a cathode of a corresponding LED D (namely the indicator 81). An anode of the LED D is connected to the power supply terminal Vcc via a fifth resistor R5. A non-inverting input terminal of the comparator L is connected to the power supply terminal Vcc via a second resistor R2, and the non-inverting input terminal of the comparator L is also connected to one of the corresponding pins 71. An inverting input terminal of the comparator L is connected to the power supply terminal Vcc via a third resistor R3, and the inverting input terminal of the comparator L is grounded via a fourth resistor R4. Resistors are selected for their values such that: $R1/(R1+R2)<R4/(R3+R4)$. In this embodiment, the comparator L is an LM393, and the resistances R1, R2, R3, and R4 are respectively 1.5 k$\Omega$, 150 k$\Omega$, 150 k$\Omega$, and 150 k$\Omega$ resistors.

Figure 4:
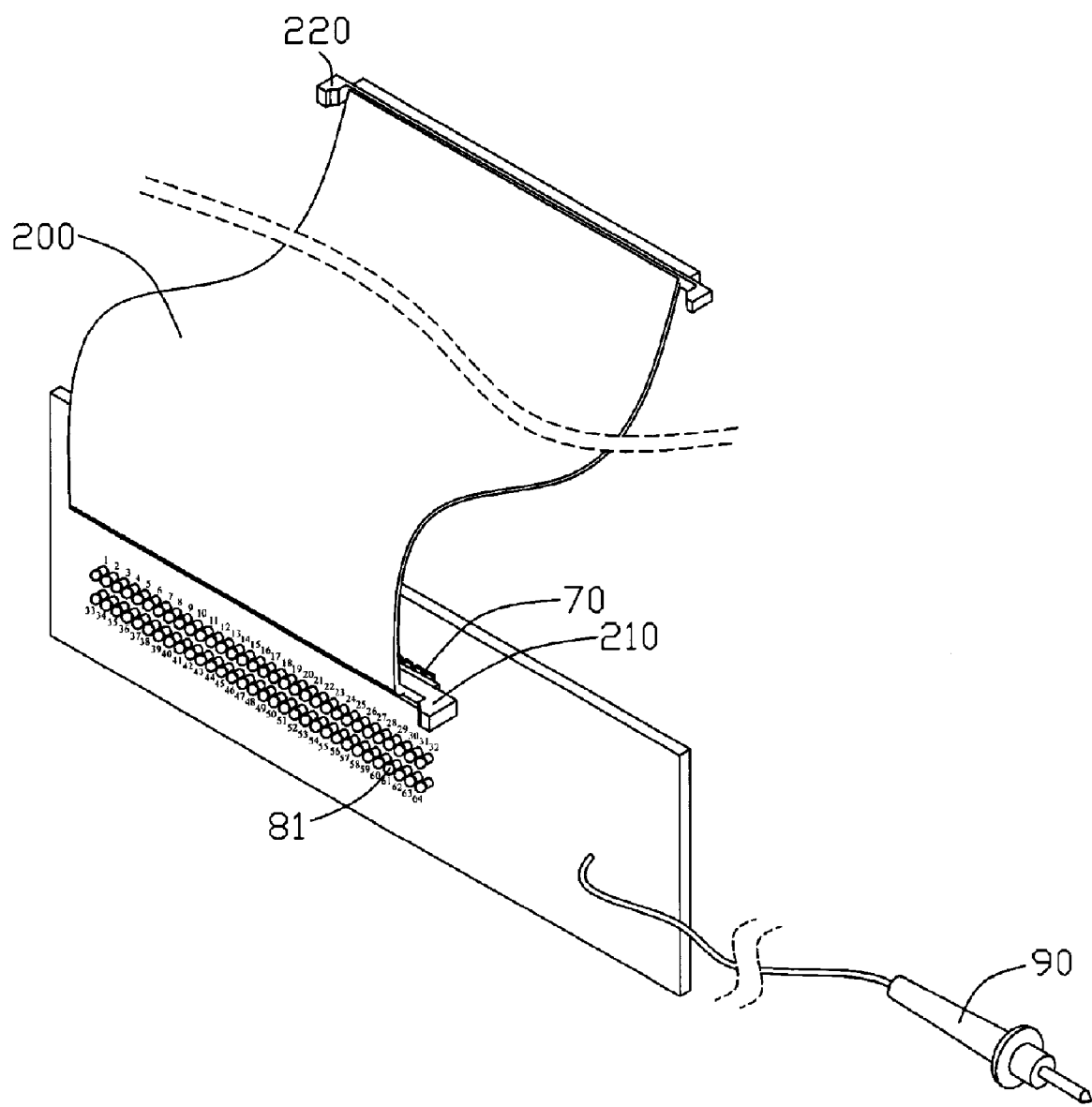
FIG. 4 is an isometric view of the plate of the testing apparatus of FIG. 1, together with a cable to be tested.

Referring also to FIG. 4, a cable 200 to be tested includes a first connector 210, a second connector 220, and a plurality of conductors. The first connector 210 is plugged into the interface 70. And then, the test probe 90 is touched to one of pins of the second connector 220. When the conductor of the cable 200 corresponding to the probed pin is good the corresponding LED D will light up. If the corresponding LED D does not light up when the probe 90 is used, the conductor of the cable 200 is open. If at least two LED Ds are lit when the probe 90 is used, there is short present between the corresponding conductors of the cable 200. In this way, all of the conductors of the cable 200 can be tested one by one for both opens and shorts.

Figure 5:
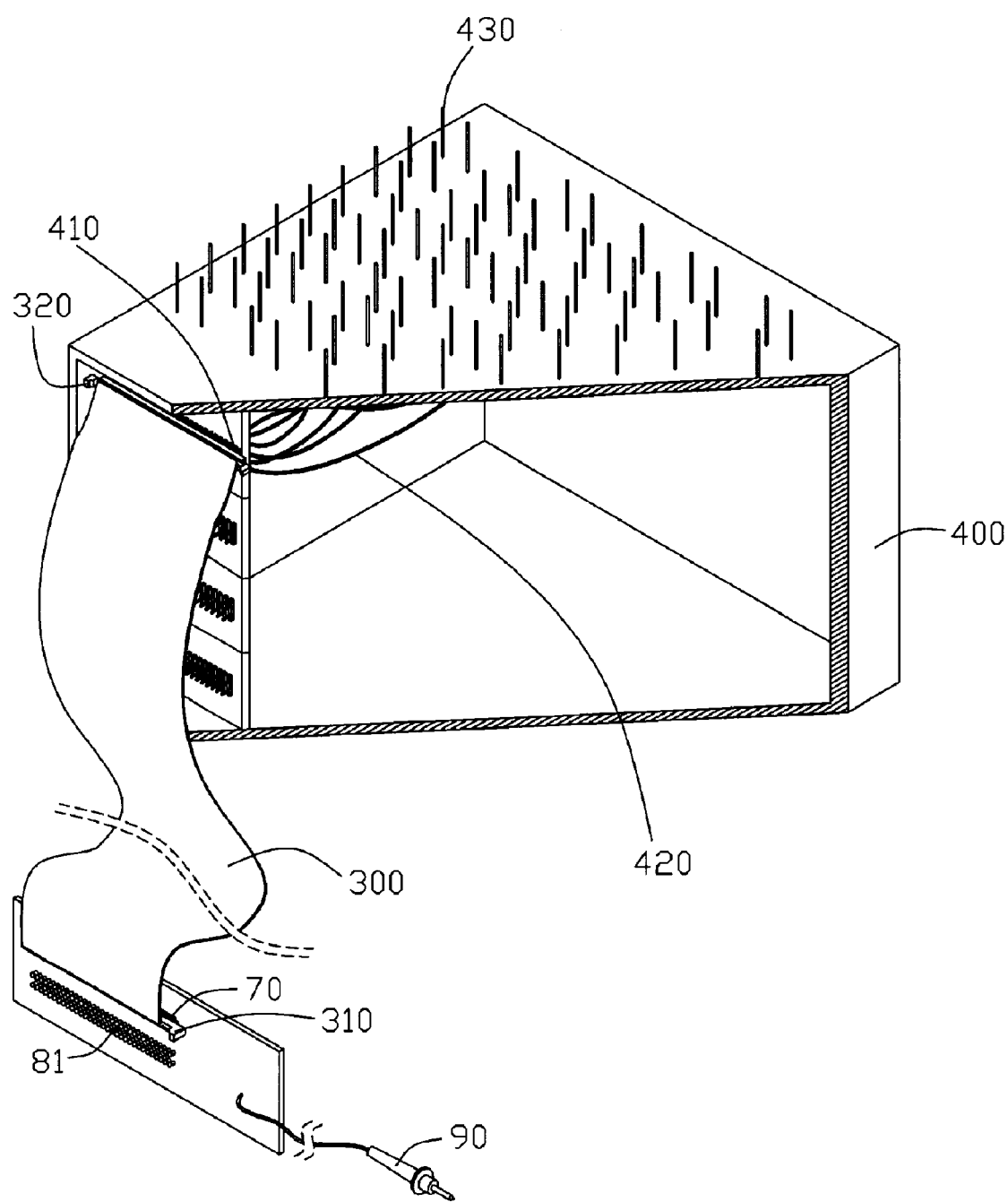
FIG. 5 is an isometric view of the plate of the testing apparatus of FIG. 1, together with a test cable, and wires used in an in circuit test bed-of-nails to be tested.

Referring to FIG. 5, a test cable 300 known to have no faults is provided. A bed-of-nails 400 is a device used for in-circuit testing (ICT) and can be tested in this embodiment in the same way as testing the cable 200. A first connector 310 of the cable 300 is plugged to the interface 70. A second connector 320 of the cable 300 is plugged to an interface 410 of the bed-of-nails 400. Each wire 420 respectively connects each nail 430 of the bed-of-nails 400. Thus, the bed-of-nails 400 is connected to the testing apparatus. And then, the test probe 90 is touched to one of the nails 430 of the bed-of-nails 400. Thus, each wire 420 can be tested one by one for both opens and shorts.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An apparatus adapted for testing a cable having a plurality of conductors, the apparatus comprising:
   a power supply terminal;
   a test probe which is grounded;
   an interface having a plurality of pins thereon;
   a plurality of indicators with anodes connected to the power supply terminal, each of the indicators corresponding to a pin of the interface; and
   a plurality of control circuits, each of the pins and a cathode of a corresponding indicator being correspondingly connected to one control circuit, wherein when the test probe touches one pin of the interface, the corresponding indicator of the pin will be lit.

2. The apparatus as claimed in claim 1, wherein the test probe is grounded via a first resistor, each of the control circuits includes a voltage comparator, an output terminal of the comparator is connected to a cathode of the corresponding indicator, an anode of the indicator is connected to the power supply terminal via a resistor, a non-inverting input terminal of the comparator is connected to the power supply terminal via a second resistor, the non-inverting input terminal of the comparator is also connected to the corresponding pin of the interface, an inverting input terminal of the comparator is connected to the power supply terminal via a third resistor, the inverting input terminal of the comparator is also grounded via a fourth resistor, resistances of the first resistor, the second resistor, the third resistor, and the fourth resistor are selected such that: $R1/(R1+R2)<R4/(R3+R4)$.

3. The apparatus as claimed in claim 2, wherein the resistances of the first resistor, the second resistor, the third resistor, and the fourth resistor are respectively 1.5 k$\Omega$, 150 k$\Omega$, 150 k$\Omega$, and 150 k$\Omega$.

4. The apparatus as claimed in claim 1, wherein each of the indicators is labeled with a number corresponding to the pins of the interface.

5. The apparatus as claimed in claim 1, wherein the indicators are light emitting diodes.

6. A method for testing wires used in an bed-of-nails having at least one interface comprising a plurality of pins, and a plurality of nails, the pins of the interface being correspondingly connected to the nails via the wires, the method comprising the steps of:
   providing a test cable, a power supply terminal, a grounded test probe, an interface having a plurality of pins thereon, a plurality of indicators, and a plurality of control circuits, the test cable including a plurality of conductors, a first connector, and a second connector;
   connecting anodes of the indicators to the power supply terminal;
   connecting each of the pins of the interface and a cathode of a corresponding indicator to a corresponding control circuit;
   electrically connecting the first connector of the test cable to the interface;
   electrically connecting the second connector of the test cable to the interface of the bed-of-nails; and
   using the test probe consecutively touch each nail of the bed-of-nails so as to verify electrify transmission normality of the wires used in the bed-of-nails based on signals of the indicators.

7. The method as claimed in claim 6, wherein the test probe is grounded via a first resistor, each of the control circuits includes a voltage comparator, an output terminal of the comparator is connected to a cathode of the corresponding indicator, an anode of the indicator is connected to the power supply terminal via a resistor, a non-inverting input terminal of the comparator is connected to the power supply terminal via a second resistor, the non-inverting input terminal of the comparator is also connected to the corresponding pin of the interface, an inverting input terminal of the comparator is connected to the power supply terminal via a third resistor, the inverting input terminal of the comparator is also grounded via a fourth resistor, resistances of the first resistor, the second resistor, the third resistor, and the fourth resistor are selected such that: $R1/(R1+R2)<R4/(R3+R4)$.

8. The method as claimed in claim 7, wherein the resistances of the first resistor, the second resistor, the third resistor, and the fourth resistor are respectively 1.5 k$\Omega$, 150 k$\Omega$, 150 k$\Omega$, and 150 k$\Omega$.

9. The method as claimed in claim 6, wherein each of the indicators is labeled with a number corresponding to the pins of the interface.

10. The method as claimed in claim 6, wherein the indicators are light emitting diodes.

* * * * *